(12) United States Patent
Rohilla et al.

(10) Patent No.: US 8,981,754 B1
(45) Date of Patent: Mar. 17, 2015

(54) PROGRAMMABLE REFERENCE SIGNAL SELECTION

(75) Inventors: Gajender Rohilla, Bothell, WA (US); Harold Kutz, Edmonds, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 779 days.

(21) Appl. No.: 12/777,090

(22) Filed: May 10, 2010

Related U.S. Application Data

(60) Provisional application No. 61/176,908, filed on May 10, 2009.

(51) Int. Cl.
G05F 1/59 (2006.01)
G05F 1/595 (2006.01)

(52) U.S. Cl.
USPC .......................................... 323/312; 323/282

(58) Field of Classification Search
USPC ........................... 323/285, 311–315, 271–283
See application file for complete search history.

(56) References Cited

U.S. PATENT DOCUMENTS

| | | | | |
|---|---|---|---|---|
| 5,694,032 A * | 12/1997 | Gersbach et al. | ............. | 323/315 |
| 5,959,343 A * | 9/1999 | Harada et al. | ................. | 257/528 |
| 6,049,244 A * | 4/2000 | Milanesi | ........................ | 327/512 |
| 6,177,785 B1 * | 1/2001 | Lee | ............... | 323/281 |
| 6,717,436 B2 | 4/2004 | Kress et al. | | |
| 6,922,042 B2 * | 7/2005 | Umemoto et al. | ............ | 323/283 |
| 7,068,019 B1 * | 6/2006 | Chiu | .............................. | 323/281 |
| 7,102,394 B1 * | 9/2006 | Wilson et al. | .................... | 327/54 |
| 7,598,715 B1 * | 10/2009 | Hariman et al. | ............... | 323/271 |
| 8,040,652 B2 * | 10/2011 | Forghani-zadeh et al. | .. | 361/93.9 |
| 2007/0132436 A1 * | 6/2007 | Westwick et al. | ............. | 323/262 |
| 2007/0159141 A1 * | 7/2007 | Shih | .............................. | 323/207 |

FOREIGN PATENT DOCUMENTS

| | | | |
|---|---|---|---|
| EP | 0871223 A | 10/1998 | |
| EP | 1713252 A | 10/2006 | |

OTHER PUBLICATIONS

Esc99_Class413 "Rapidly Developing Embedded Systems Using Configurable Processors" dated Dec. 6, 2013; 13 pages.
Faura et al.,"A New Field Programmable System—On-A-Chip for Mixed Signal Integration" dated Dec. 6, 2013; 1 page.
Faura et al.,"FIPSOC: A Field Programmable System on a Chip" dated Dec. 6, 2013; 6 pages.
Faura et al.,"Multicontext Dynamic Reconfiguration" dated Dec. 6, 2013; 11 pages.
Faura et al.,"Programmable Analog Hardware" dated Dec. 6, 2013; 4 pages.
Faura et al.,"Tradeoffs for the Design of Programmable Interconnections" dated Dec. 6, 2013; 5 pages.
Faura et al.,"VHDL Modeling of Fast Dynamic Reconfiguration" dated Dec. 6, 2013; 7 pages.
FP4 Project Synopses—Europe 1996 dated Dec. 6, 2013; 191 pages.

(Continued)

*Primary Examiner* — Adolf Berhane
*Assistant Examiner* — Nusrat Quddus

(57) ABSTRACT

A processing system measures an input voltage received at an input of an analog circuit, such as an analog-to-digital converter (ADC), where the input voltage is measured by comparing the input voltage to a reference voltage. The reference voltage is determined by the difference between a first voltage and a ground voltage. The processing system includes a programmable reference signal selection circuit to maintain the reference voltage at a constant level.

21 Claims, 3 Drawing Sheets

(56) References Cited

OTHER PUBLICATIONS

Julio Faura et al.; "A Novel Mixed Signal Programmable Device With On-Chip Microprocessor", 1997, IEEE 1997 Custom Integrated Circuits Conference, pp. 103-106; 4 pages.

Lecuyer et al., "Raise a Detailed Routing Algorithm" dated Dec. 6, 2013; 4 pages.

Moreno et al., "Feasible Evolutionary and Self Repairing Hardware" dated Dec. 6, 2013; 12 pages.

Moreno et al., "FIPSOC. A Novel" dated Dec. 6, 2013; 5 pages.

* cited by examiner

US 8,981,754 B1

PROGRAMMABLE REFERENCE SIGNAL SELECTION

RELATED APPLICATIONS

This application claims the benefit of U.S. Provisional Application No. 61/176,908 filed on May 10, 2009.

TECHNICAL FIELD

This disclosure relates to the field of integrated circuits and, in particular, to selection of a programmable reference signal for an integrated circuit.

BACKGROUND

Many integrated circuits rely on precision measurements of various signals to ensure proper functionality. For example, a temperature sensor may rely on accurate voltage measurements in order to correctly identify a given temperature. In order to determine the actual value of a signal, the measured value of a signal is compared to a reference signal having a known value. The difference between the known value of the reference signal and the measured value is used to determine the actual value of the signal. The comparison may be performed, for example, using an analog-to-digital converter (ADC).

In certain systems, a ground reference voltage is brought on to a chip through an input/output (I/O) pad. The ground reference voltage is used with an on-chip bandgap reference voltage generator to generate a bandgap reference voltage used as a reference signal input to an ADC. The ADC can use the reference signal to make any number of signal measurements. However, current flow in the ground path through the bandgap reference voltage generator can create errors in absolute accuracy measurements in relation to the ground reference voltage. Metal routes used to carry signals in the chip have a nominal parasitic resistance. When current flows through the metal routes, a voltage drop occurs across the parasitic resistance. This voltage drop may change the value of the bandgap reference voltage and the value of an on-chip ground voltage, causing any measurement made by the ADC to be inaccurate compared to actual values.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described to make precision measurements of an input voltage in a processing system. An analog-to-digital converter (ADC) may receive the input voltage at an input terminal and measure the input voltage by comparing the input voltage to a reference voltage. The reference voltage may be determined by the difference between a first voltage and a ground voltage. The processing system includes a programmable reference signal selection circuit to maintain the reference voltage at a constant level, so that the measurement of the input voltage is as accurate as possible. Maintaining the reference voltage at a constant level may include adjusting either the first voltage or the ground voltage to compensate for a voltage drop attributable to parasitic resistance in the ground line. As described below, in one embodiment, an on-chip ground voltage may be taken off-chip for measurement and the first voltage may be adjusted by a corresponding amount. In another embodiment, a bandgap reference voltage used as the first voltage may be measured off-chip and an-off chip ground voltage is applied to the ADC compensate for any error.

Figure 1:
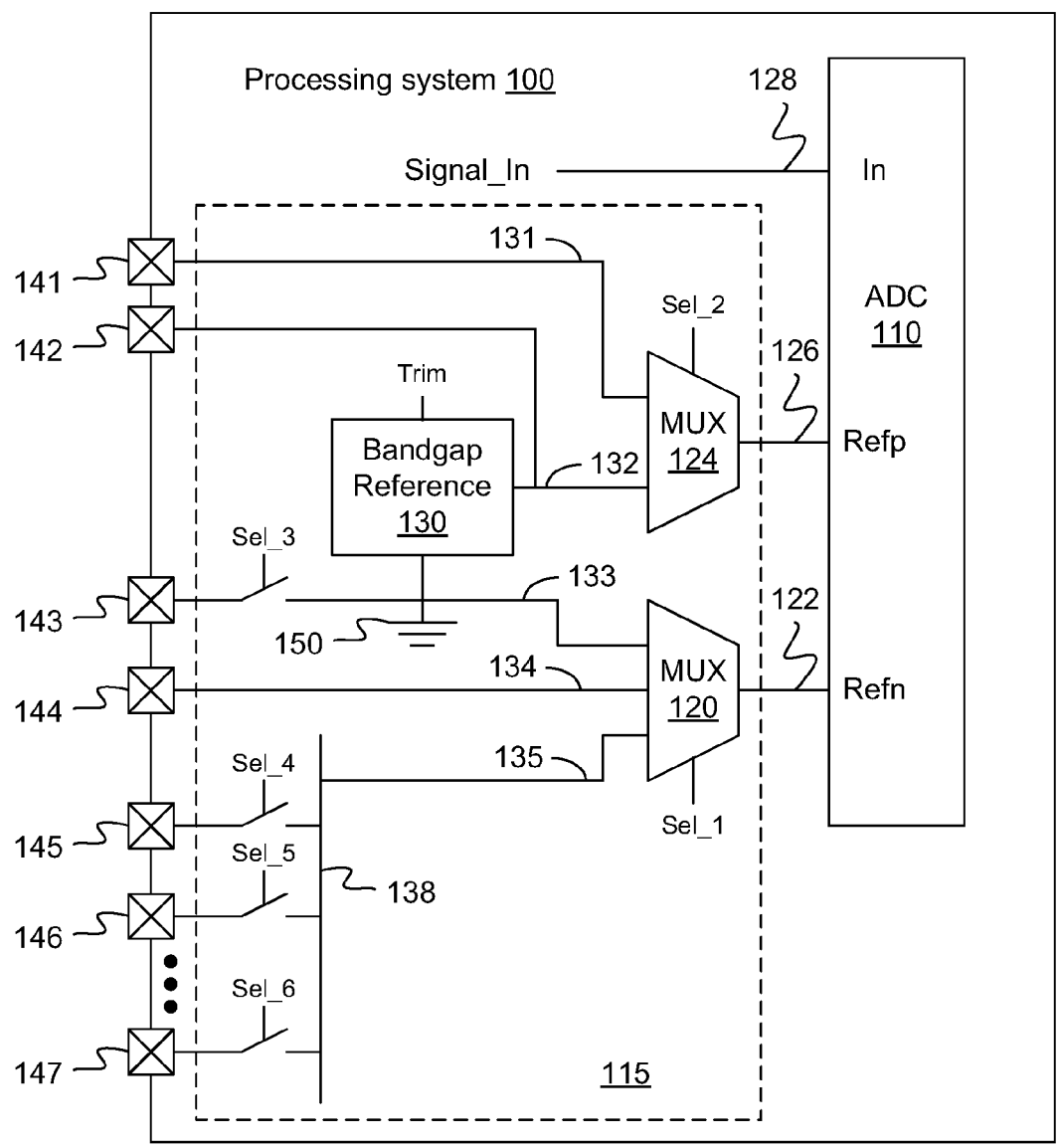
FIG. 1 is a block diagram illustrating a processing system with programmable reference signal selection according to an embodiment.

FIG. 1 is a block diagram illustrating a processing system 100 with programmable reference signal selection according to an embodiment of the present invention. In one embodiment, the processing system 100 includes an analog circuit 110 which may be used to make a precision measurement of any signal in or received by processing system 100. In one embodiment analog circuit 110 is an analog-to-digital converter. In other embodiments, analog circuit 110 may be a digital-to-analog converter (DAC) or other data converter, or other measurement or sensing circuit dependent on a stable reference voltage. The signal being measured, Signal_In, is received at an input terminal 128 of ADC 110. Signal_In may be any voltage signal in processing system 110 requiring a precision measurement, such as for example, a signal from a temperature or pressure sensor (not shown). The value of Signal_In is determined by ADC 110 by comparing Signal_In to a reference voltage. In one embodiment the reference voltage is determined from the difference between a first voltage 126 received by ADC 110 at input Refp and a ground voltage 122 received by ADC 110 at input Refn. In one embodiment, processing system 110 provides the ability to maintain the reference voltage (i.e., the difference between the first voltage 126 and the ground voltage 122) at a constant level.

In one embodiment, processing system 100 includes programmable reference signal selection circuit 115. Programmable reference signal selection circuit 115 includes a first selection circuit (e.g., a multiplexer) 120 to select between a number of signals for the ground voltage 122 and a second selection circuit 124 to select between a number of signals for the first voltage 126. Selection circuits 120 and 124 may be controlled by control signals Sel_1 and Sel_2, respectively. Control signals Sel_1 and Sel_2 may be generated within processing system 100 by a CPU, by a direct memory access (DMA) transfer into a register, by a programmable or fixed function digital circuit, or by some other signal generation means. In other embodiments, control signals Sel_1 and Sel_2 are received from an external circuit.

In one embodiment, selection circuit 124 receives signals 131 and 132 as inputs and provides an output, based on control signal Sel_2, to ADC 110 as the first voltage 126. Signal 131 may be an off-chip voltage signal received by the processing system 100 at input/output (I/O) pad 141 and signal 132 may be a reference voltage generated by reference voltage generator 130. In one embodiment, reference voltage generator 130 may be a bandgap reference voltage generator generating a bandgap reference voltage 132.

In one embodiment, selection circuit 120 receives signals 133, 134 and 135 as inputs and provides an output, based on control signal Sel_1, to ADC 110 as the ground voltage 122. Signal 133 may be coupled to an on-chip ground 150. On-chip ground 150 may be further coupled to I/O pad 143 through a switch controlled by control signal Sel_3. When control signal Sel_3 activates the switch, the on-chip ground 150 may be taken off-chip at I/O pad 143 to be measured, as discussed further below. Signal 134 may be an off-chip ground signal received by the processing system 100 at I/O pad 144 and signal 135 may be an off-chip ground signal received from bus 138 which is coupled to a number of I/O pads 145, 146 and 147. Each of I/O pads 145, 146 and 147 may be coupled to bus 138 through a switch controlled by control signals Sel_4, Sel_5 and Sel_6 respectively. Each of control signals Sel_3, Sel_4, Sel_5 and Sel_6 may be generated by the same or different signal generation means as control signals Sel_1 and Sel_2 discussed above.

Figure 2:
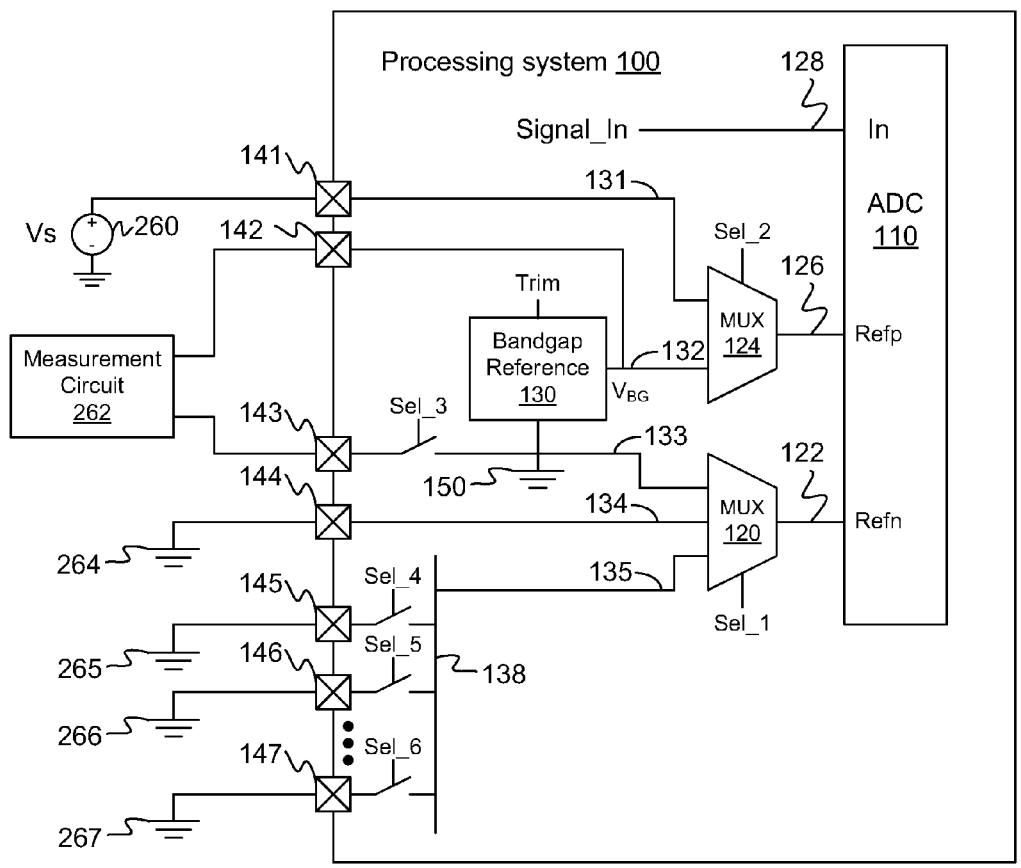
FIG. 2 is a block diagram illustrating a processing system with programmable reference signal selection according to an embodiment.

FIG. 2 is a block diagram illustrating a processing system 100 with programmable reference signal selection according to an embodiment of the present invention. In one embodiment, external voltage source 260 is coupled to I/O pad 141. The voltage $V_S$ supplied by voltage source 260 may be provided to selection circuit 124 as signal 131. Selection circuit 124 may select between $V_S$ and $V_{BG}$ 132 for first voltage 126 which is applied to ADC 110 at input Refp.

Measurement circuit 262 is coupled to I/O pads 142 and 143 to receive $V_{BG}$ 132 and/or on-chip ground 150. Measurement circuit 262 may be any circuit capable of measuring the value of either $V_{BG}$ 132 or on-chip ground 150, such as for example, a voltmeter, potentiometer, oscilloscope, or other measurement circuit. I/O Pads 144, 145, 146 and 147 are coupled to one or more off-chip grounds 264, 265, 266 and 267. The off-chip grounds may be coupled to selection circuit 120 either directly, as signal 134, or through a switch and bus 138 as signal 135. Selection circuit 120 may select between on-chip ground 150 and off-chip grounds 264, 265, 266 and 267 for ground voltage 122 which is applied to ADC 110 at input Refn.

In order to maintain the reference voltage at a constant level, the difference between the first voltage 126 and the ground voltage 122 must remain constant or as close to constant as possible. Parasitic resistance in the ground line, which may be caused by current flowing through bandgap reference generator 130 or other circuit to on-chip ground 150, may cause voltage drops leading to errors in absolute accuracy measurements. The voltage drops may cause ground voltage 122 to fluctuate, causing the reference voltage to change. A change in the reference voltage may cause the comparison with Signal_in, and thus the measurement of Signal_in, to be inaccurate. The system 100 may be programmable, such that in order to compensate for the fluctuations, either the first voltage or the ground voltage may be varied to maintain the difference between the two at a constant level. The choice of how to maintain the reference voltage at a constant level may be user-configurable through programming instructions executed by the processor (see FIG. 3) which controls the selection circuits and switches in processing system 100.

In one embodiment, control signal Sel_3 is activated, closing the switch between on-chip ground 150 and I/O pad 143. The on-chip ground voltage 150 of processing system 100 is applied to I/O pad 143. External measurement circuit 262 may receive on-chip ground 150 and determine its measured value, as affected by the parasitic resistance in the ground line. The difference between the measured value of on-chip ground 150 and actual ground is determined so that the first voltage 126 may be adjusted by the corresponding amount. In one embodiment, the voltage $V_S$ provided by voltage source 260 is adjusted to the corresponding value and applied to I/O pad 141. $V_S$ is provided to selection circuit 124 as signal 131 which, based on control signal Sel_2, is configured to pass signal 131 to ADC 110 as first voltage 126. In another embodiment, a control signal Trim is provided to bandgap reference voltage generator 130 by the processor of processing system 100 which, based on feedback from the measurement of on-chip ground 150 by measurement circuit 262, trims the output $V_{BG}$ of bandgap reference voltage generator 130 by the corresponding amount. Bandgap reference voltage generator 130 may include a trim circuit (not shown) which is configured to trim the output voltage in response to the control signal Trim according to any of the various known voltage trimming methods. The trimmed output is provided to selection circuit 124 as signal 132 and selection circuit, based on control signal Sel_2, selects signal 132 as first voltage 126 for ADC 110. In both embodiments, selection circuit 120 is configured by control signal Sel_1 to provide on-chip ground 150 to ADC 110 as ground voltage 122.

In another embodiment, the output voltage $V_{BG}$ of bandgap reference voltage generator 130 is applied to I/O pad 142. External measurement circuit 262 may receive $V_{BG}$ and determine its measured value, as affected by the parasitic resistance in the ground line. The difference between the measured value of $V_{BG}$ and the intended value is determined so that the ground voltage 122 may be adjusted by the corresponding amount. In one embodiment, the off-chip ground 264 is adjusted to the corresponding value and applied to I/O pad 144. Off-chip ground 264 is provided to selection circuit 120 as signal 134 which, based on control signal Sel_1, is configured to pass signal 134 to ADC 110 as ground voltage 122. In other embodiments, another off-chip ground 265, 266, 267 may be provided to ADC 110 as ground voltage 122. In either case, selection circuit 124 is configured by control signal Sel_2 to provide signal 132 to ADC 110 as first voltage 126.

In the embodiments described above, adjusting either the first voltage or the ground voltage to compensate for variations in the measured value of the other voltage ensures that the difference between the first voltage and the ground voltage remains constant. This constant reference voltage allows ADC 110 to make an accurate measurement of input signal Signal_in by comparing Signal_in the reference voltage. ADC 110 may provide the results of the measurement as a digital output signal to any number of circuits either in the processing system 100 or external to the processing system through an I/O pad.

Figure 3:
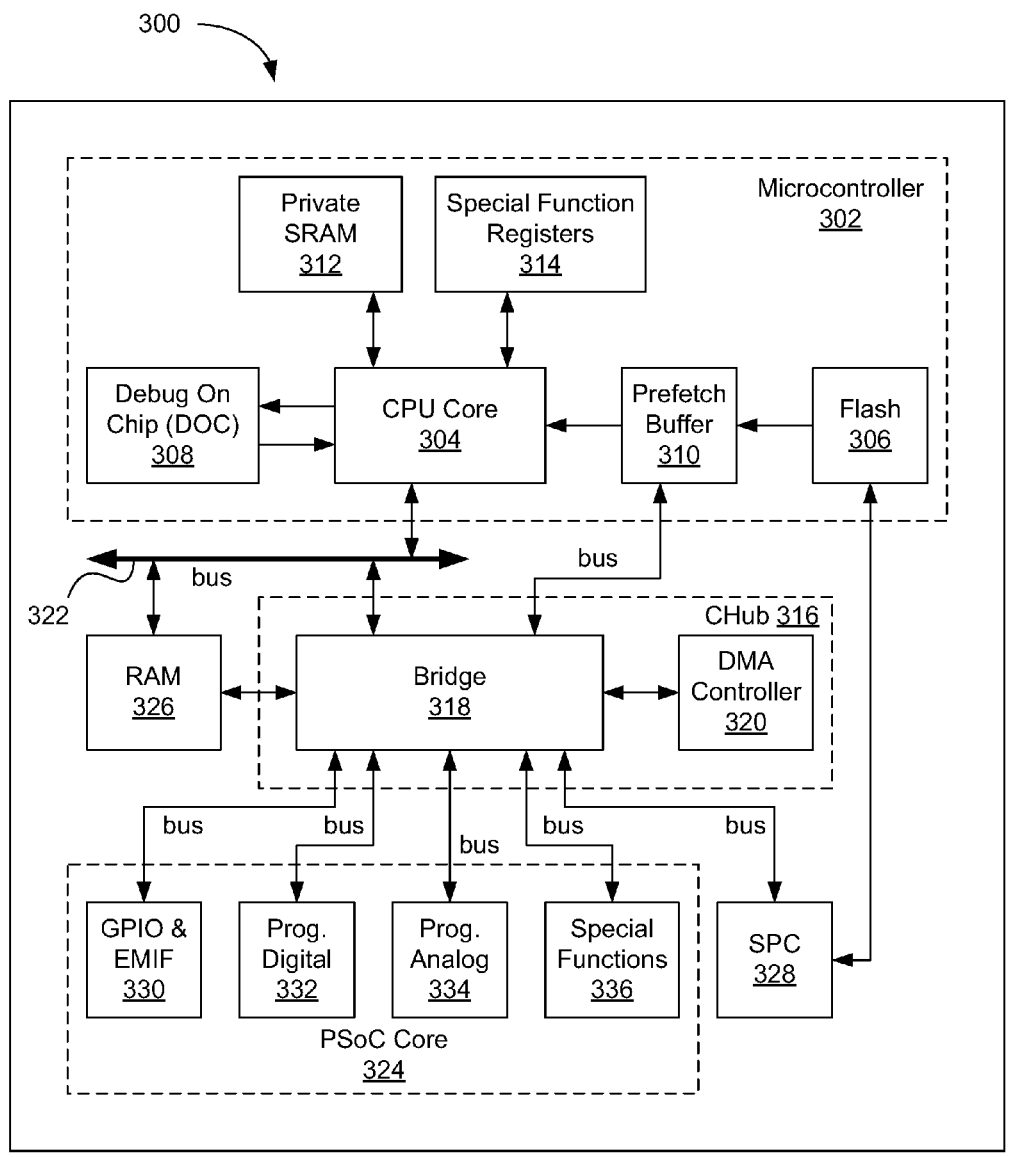
FIG. 3 is a block diagram illustrating a processing device architecture, according to an embodiment.

FIG. 3 illustrates an embodiment of a core architecture 300 of a Programmable System-on-Chip (PSoC®), such as that used in the PSoC3® family of products offered by Cypress Semiconductor Corporation (San Jose, Calif.). In one embodiment, the core architecture 300 may represent processing system 100 as discussed above. In one embodiment, the core architecture 300 includes a microcontroller 302. The microcontroller 302 includes a CPU (central processing unit) core 304, flash program storage 306, DOC (debug on chip) 308, a prefetch buffer 310, a private SRAM (static random access memory) 312, and special functions registers 314. In an embodiment, the DOC 308, prefetch buffer 310, private SRAM 312, and special function registers 314 are coupled to the CPU core 304, while the flash program storage 306 is coupled to the prefetch buffer 310.

The core architecture 300 may also include a CHub (core hub) 316, including a bridge 318 and a DMA (direct memory access) controller 320, that is coupled to the microcontroller 302 via bus 322. The CHub 316 may provide the primary data and control interface between the microcontroller 302 and its peripherals and memory, and a programmable core 324. The DMA controller 320 may be programmed to transfer data between system elements without burdening the CPU core 304. In various embodiments, each of these subcomponents of the microcontroller 302 and CHub 316 may be different with each choice or type of CPU core 304. The Chub 316 may also be coupled to shared SRAM 326 and an SPC (system performance controller) 328. The private SRAM 312 is independent of the shared SRAM 326 that is accessed by the microcontroller 302 through the bridge 318. The CPU core 304 accesses the private SRAM 312 without going through the bridge 318, thus allowing local register and RAM accesses to occur simultaneously with DMA access to shared SRAM 326. Although labeled here as SRAM, these memory modules may be any suitable type of a wide variety of (volatile or non-volatile) memory or data storage modules in various other embodiments.

In various embodiments, the programmable core 324 may include various combinations of subcomponents (not shown), including, but not limited to, a digital logic array, digital peripherals, analog processing channels, global routing analog peripherals, DMA controller(s), SRAM and other appropriate types of data storage, IO ports, and other suitable types of subcomponents. In one embodiment, the programmable core 324 includes a GPIO (general purpose IO) and EMIF (extended memory interface) block 330 to provide a mechanism to extend the external off-chip access of the microcontroller 302, a programmable digital block 332, a programmable analog block 334, and a special functions block 336, each configured to implement one or more of the subcomponent functions. In various embodiments, the special functions block 336 may include dedicated (non-programmable) functional blocks and/or include one or more interfaces to dedicated functional blocks, such as USB, a crystal oscillator drive, JTAG, and the like.

The programmable digital block 332 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 332 may be configured to perform various digital functions, including, but not limited to, one or more of the following functions: a basic I2C slave; an I2C master; a SPI master or slave; a multi-wire (e.g., 3-wire) SPI master or slave (e.g., MISO/MOSI multiplexed on a single pin); timers and counters (e.g., a pair of 8-bit timers or counters, one 16 bit timer or counter, one 8-bit capture timer, or the like); PWMs (e.g., a pair of 8-bit PWMs, one 16-bit PWM, one 8-bit deadband PWM, or the like), a level sensitive I/O interrupt generator; a quadrature encoder, a UART (e.g., half-duplex); delay lines; and any other suitable type of digital function or combination of digital functions which can be implemented in a plurality of UDBs.

In other embodiments, additional functions may be implemented using a group of two or more UDBs. Merely for purposes of illustration and not limitation, the following functions can be implemented using multiple UDBs: an I2C slave that supports hardware address detection and the ability to handle a complete transaction without CPU core (e.g., CPU core 304) intervention and to help prevent the force clock stretching on any bit in the data stream; an I2C multi-master which may include a slave option in a single block; an arbitrary length PRS or CRC (up to 32 bits); SDIO; SGPIO; a digital correlator (e.g., having up to 32 bits with 4× over-sampling and supporting a configurable threshold); a LINbus interface; a delta-sigma modulator (e.g., for class D audio DAC having a differential output pair); an I2S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto BAUD rate detection and generation (e.g., automatically determine BAUD rate for standard rates from 1200 to 115200 BAUD and after detection to generate required clock to generate BAUD rate); and any other suitable type of digital function or combination of digital functions which can be implemented in a plurality of UDBs.

The programmable analog block 334 may include analog resources including, but not limited to, comparators, mixers, PGAs (programmable gain amplifiers), TIAs (trans-impedance amplifiers), ADCs (analog-to-digital converters), DACs (digital-to-analog converters), voltage references, current sources, sample and hold circuits, and any other suitable type of analog resources. The programmable analog block 334 may support various analog functions including, but not limited to, analog routing, LCD drive IO support, capacitive sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method, comprising:
    measuring an input voltage received at an input of an analog circuit in a processing system, wherein measuring the input voltage comprises comparing the input voltage to a reference voltage, wherein the reference voltage comprises a difference between a first voltage and a ground voltage; and
    maintaining the reference voltage by varying at least one of the first voltage and the ground voltage, with respect to the other of the first voltage and the ground voltage, in order to maintain the difference between the first voltage and the ground voltage at a constant level;
    wherein maintaining the reference voltage comprises:
        a first selection circuit selecting the first voltage from a plurality of voltages; and
        a second selection circuit selecting the ground voltage from a plurality of ground voltages.

2. The method of claim 1, wherein maintaining the reference voltage comprises varying the first voltage with respect to the ground voltage.

3. The method of claim 2, wherein varying the first voltage comprises:
    applying an on-chip ground voltage of the processing system to a first input/output (I/O) pad of the processing system;
    measuring the on-chip ground voltage with a measurement circuit, wherein the measurement circuit is external to the processing system; and
    adjusting the first voltage based on the measurement of the on-chip ground voltage.

4. The method of claim 3, wherein adjusting the first voltage comprises:
    trimming a bandgap reference voltage generated by a bandgap reference voltage generator in the processing system; and
    selecting the bandgap reference voltage as the first voltage for the analog circuit.

5. The method of claim 3, wherein adjusting the first voltage comprises:
    applying an off-chip voltage to a second I/O pad of the processing system; and
    selecting the off-chip voltage as the first voltage for the analog circuit.

6. A method, comprising:
    measuring an input voltage received at an input of an analog circuit in a processing system, wherein measuring the input voltage comprises comparing the input voltage to a reference voltage, wherein the reference voltage comprises a difference between a first voltage and a ground voltage; and
    maintaining the reference voltage by varying at least one of the first voltage and the ground voltage, with respect to the other of the first voltage and the ground voltage, in order to maintain the difference between the first voltage and the ground voltage at a constant level;
    wherein maintaining the reference voltage comprises varying the ground voltage with respect to the first voltage.

7. The method of claim 6, wherein varying the ground voltage comprises:
    applying a bandgap reference voltage generated by a bandgap reference voltage generator in the processing system to a first I/O pad of the processing system;
    measuring the bandgap reference voltage with a measurement circuit, wherein the measurement circuit is external to the processing system;
    applying an off-chip ground voltage to a second I/O pad of the processing system; and
    selecting the off-chip ground voltage as the ground voltage for the analog circuit.

8. The method of claim 1, wherein the analog circuit comprises an analog-to-digital converter (ADC).

9. A processing device, comprising:
    an analog circuit configured to receive an input voltage at an input terminal, a first voltage at a first reference terminal, and a ground voltage at a second reference terminal, wherein the analog circuit is configured to compare the input voltage to a difference between the first voltage and the ground voltage to measure a value of the input voltage; and
    a programmable reference signal selection circuit coupled to the analog circuit, the programmable reference signal selection circuit configured to maintain the difference between the first voltage and the ground voltage at a constant level by varying at least one of the first voltage and the ground voltage with respect to the other of the first voltage and the ground voltage;
    wherein the programmable reference signal selection circuit comprises:
        a first selection circuit coupled to the first reference terminal, the first selection circuit is to select the first voltage from a plurality of voltages; and
        a second selection circuit coupled to the second reference terminal, the second selection circuit is to select the ground voltage from a plurality of ground voltages.

10. The processing device of claim 9, wherein the plurality of voltages comprises a bandgap reference voltage generated by a bandgap reference voltage generator and a off-chip voltage generated by an external voltage supply.

11. The processing device of claim 9, wherein the plurality of ground voltages comprises an on-chip ground voltage and an off-chip ground voltage.

12. The processing device of claim 11, further comprising:
    a first ground signal line coupled between the on-chip ground voltage and a first input/output (I/O) pad of the processing device.

13. The processing device of claim 12, wherein the first I/O pad is coupled to a measurement circuit external to the processing device, and wherein the measurement circuit is configured to measure the on-chip ground voltage.

14. The processing device of claim 12, further comprising:
a second ground signal line coupled between a second I/O pad and the second selection circuit, the second ground signal line to apply the off-chip ground voltage to the analog circuit as the ground voltage.

15. The processing device of claim 10, further comprising:
a first voltage signal line coupled between a first I/O pad of the processing device and the first selection circuit, the first voltage signal line to apply the off-chip voltage to the analog circuit as the first voltage.

16. The processing device of claim 15, further comprising:
a second voltage signal line coupled between a second I/O pad and an output of the bandgap reference voltage generator, wherein the second I/O pad is coupled to a measurement circuit external to the processing device, and wherein the measurement circuit is configured to measure the bandgap reference voltage.

17. The processing device of claim 9, wherein the analog circuit comprises an analog-to-digital converter (ADC).

18. A system comprising:
a central processing unit (CPU); and
a processing device coupled to the CPU, the processing device comprising:
an analog circuit configured to receive an input voltage, a first voltage, and a ground voltage, wherein the analog circuit is configured to compare the input voltage to a difference between the first voltage and the ground voltage to measure a value of the input voltage; and
a programmable reference signal selection circuit coupled to the analog circuit, the programmable reference signal selection circuit configured to maintain the difference between the first voltage and the ground voltage at a constant level by varying at least one of the first voltage and the ground voltage with respect to the other of the first voltage and the ground voltage, wherein the programmable reference signal selection circuit comprises a first selection circuit configured to select the first voltage from a plurality of voltages and a second selection circuit configured to select the ground voltage from a plurality of ground voltages.

19. The system of claim 18, wherein the system further comprises an off-chip ground voltage source coupled to the processing device, and the processing device further comprises an on-chip ground voltage source coupled to the second selection circuit.

20. The system of claim 18, wherein the processing device further comprises a bandgap reference voltage generator coupled to the first selection circuit.

21. The system of claim 20, wherein the system further comprises an off-chip voltage source and a measurement circuit that are coupled to the processing device.

* * * * *